United States Patent [19]

Hong

[11] Patent Number: 5,569,945
[45] Date of Patent: Oct. 29, 1996

[54] STEPPED FLOATING GATE EPROM DEVICE

[75] Inventor: Gary Hong, Hsin-Chu, Taiwan

[73] Assignee: United Microelectronics Corporation, Hsin-Chu, Taiwan

[21] Appl. No.: 387,440

[22] Filed: Feb. 13, 1995

Related U.S. Application Data

[62] Division of Ser. No. 224,695, Apr. 8, 1994, Pat. No. 5,395,779.

[51] Int. Cl.$^6$ ............................................. H01L 29/788
[52] U.S. Cl. .......................... 257/316; 257/322; 257/326
[58] Field of Search .................................. 257/316, 321, 257/322

[56] References Cited

U.S. PATENT DOCUMENTS

| | | | |
|---|---|---|---|
| 4,373,248 | 2/1983 | McElroy | 257/316 |
| 4,988,635 | 1/1991 | Ajika et al. | 437/43 |
| 5,045,488 | 9/1991 | Yeh | 437/43 |
| 5,057,886 | 10/1991 | Riemenschneider et al. | 257/321 |

Primary Examiner—Robert P. Limanek
Attorney, Agent, or Firm—William H. Wright

[57] ABSTRACT

Fabrication of a MOSFET comprises, forming a dielectric layer on a substrate and a sacrificial structure on portions of the dielectric layer, forming a first polysilicon layer over the sacrificial structure and other exposed surfaces of the device, patterning the first polysilicon layer and the dielectric layer by masking and etching to form a stepped electrode structure partially upon the sacrificial structure and partially upon the other exposed surfaces of the device, applying ion implantation into the substrate outside of the area covered by the stepped electrode structure, removing the sacrificial layer from the surface of the substrate and from beneath the stepped electrode structure leaving an overhanging surface of the stepped electrode structure, forming a second layer of dielectric material on the exposed surfaces of the stepped electrode structure and the substrate, and forming a second polysilicon layer over and under overhanging portions the second layer of dielectric material and the substrate.

20 Claims, 4 Drawing Sheets

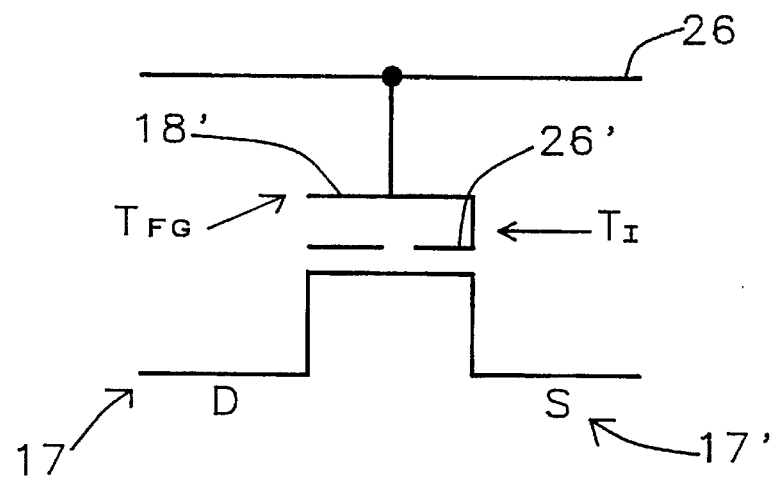
FIG. 7
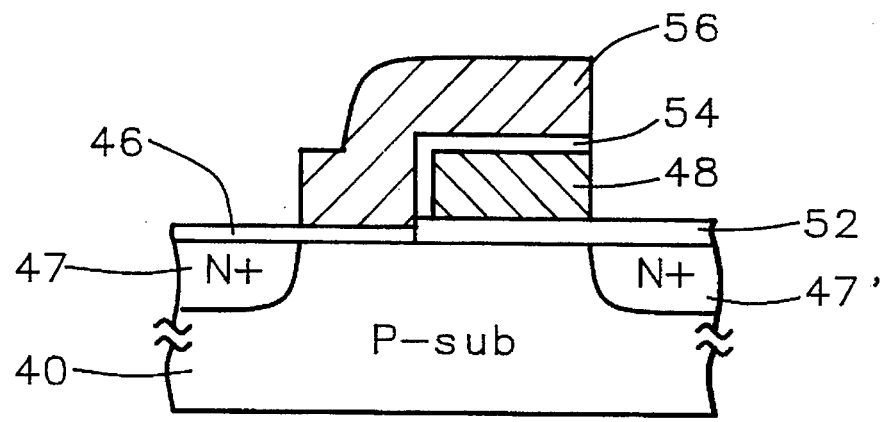
FIG. 8 - Prior Art

STEPPED FLOATING GATE EPROM DEVICE

This is a divisional of application Ser. No. 08/224,695, filed Apr. 8, 1994, which issued as U.S. Pat. No. 5,395,779.

BACKGROUND OF THE INVENTION

1. Field of the Invention

This invention relates to semiconductor memories and more particularly to devices with high capacitive coupling ratios.

2. Description of Related Art

Referring to FIG. 8, a conventional prior art split gate device is shown which includes a P− substrate 40 with N+ S/D regions 47, 47' on either side of a polysilicon 1 floating gate 48 and a polysilicon 2 control gate 56. The edge of the floating gate 48 is adjacent to one region 47'of the S/D regions but spaced away from the other region 47. The control gate 56 however, which overlies the floating gate 48 reaches the edge of the other region 47 of the S/D regions and its edge which is distal from the floating gate 48. Gate oxide is located between the control gate 56 and substrate 40. A thicker oxide layer 52 is formed between floating gate 48 and substrate 40. Samachisa et al "A 128k Flash EEPROM Using Double-Polysilicon Technology" IEEE J. Solid-State Circuits, Vol. SC-22, No. 5, pp 676–683, (October 1987) shows a conventional prior art split gate structure of the kind illustrated by FIG. 8.

U.S. Pat. No. 5,045,488 of Yeh for "Method of Manufacturing a Single Transistor Non-Volatile, Electrically Alterable Semiconductor Memory Device" and U.S. Pat. No. 4,988,635 of Ajika et al for "Method of Manufacturing Non-Volatile Semiconductor Memory Device" show processes for manufacturing EPROM devices.

SUMMARY OF THE INVENTION

An object of this invention is to provide a split gate memory with a substantially greater capacitive coupling ratio. A high coupling ratio is desirable to as follows:

1) provide lower (high) program and erase voltages;

2) provide higher read current.

In accordance with this invention a method of fabricating an MOSFET device on a semiconductor substrate comprises, forming a dielectric layer on the substrate, forming a sacrificial structure on portions of the dielectric layer, forming a first polysilicon layer over the sacrificial structure and other exposed surfaces of the device, patterning the first polysilicon layer and the dielectric layer by masking and etching to form a stepped electrode structure partially upon the sacrificial structure and partially upon the other exposed surfaces of the device, applying ion implantation into the substrate outside of the area covered by the stepped electrode structure, removing the sacrificial layer from the surface of the substrate and from beneath the stepped electrode structure leaving an overhanging surface of the stepped electrode structure, forming a second layer of dielectric material on the exposed surfaces of the stepped electrode structure and the substrate, and forming a second polysilicon layer over and under overhanging portions the second layer of dielectric material and the substrate.

Further in accordance with this invention, a method is provided for fabricating an MOSFET device on a semiconductor substrate, which method comprises forming a silicon dioxide gate oxide dielectric layer on the substrate, forming a silicon nitride sacrificial structure on portions of the dielectric layer, etching away exposed portions of the gate oxide dielectric layer to expose portions of the surface of the substrate and forming a tunnel oxide layer over exposed surfaces of the substrate, forming a first polysilicon layer over the sacrificial structure and the tunnel oxide layer, patterning the first polysilicon layer and the dielectric layer by masking and etching to form a stepped electrode structure partially upon the sacrificial structure and partially upon the tunnel oxide layer, ion implanting arsenic ions into the substrate outside of the area covered by the stepped electrode structure forming buried bit lines in the substrate, removing the sacrificial layer from the surface of the substrate and from beneath the stepped electrode structure leaving an overhanging surface of the stepped electrode structure, forming a second layer of dielectric material on the exposed surfaces of the stepped electrode structure and the substrate, and forming a second polysilicon layer over and under overhanging portions the second layer of dielectric material and the substrate.

Preferably, before forming the second layer of dielectric material on the exposed surfaces of the stepped electrode structure and the substrate buried bit lines are implanted into the substrate;

the buried bit lines are implanted into the substrate with arsenic (As) N+ dopant with an energy of about 50 keV, and a dose of As of about $3 \times 10^{15}/cm^2$;

after implanting the buried bit lines into the substrate a step of forming a self aligned thick oxide structure is performed by oxidation of the exposed surface of the substrate;

the self-aligned thick oxide structure is formed by oxidation in oxygen gas ($O_2$) at a preferred temperature of about 900° C. for a time of about 10 minutes; and the oxidation continues until a thickness of about 500 Å is obtained; and the self-aligned thick oxide structure is formed over the buried bit lines; and the second layer of dielectric material comprises ONO.

BRIEF DESCRIPTION OF THE DRAWINGS

The foregoing and other aspects and advantages of this invention are explained and described below with reference to the accompanying drawings, in which.

3

Figure 6:
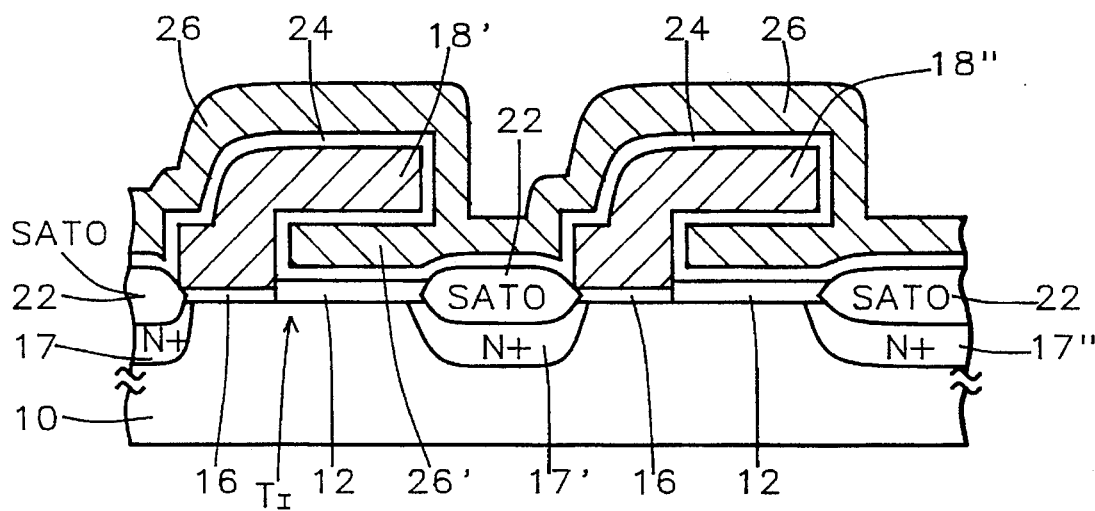
FIG. 6 shows the product of FIG. 5 after formation of interpolysilicon sandwich of a dielectric layer such as ONO followed by deposition of a polysilicon 2 layer.

FIG. 7 shows an electrical schematic diagram of a circuit formed on the device of FIG. 6 in which a polysilicon 2 layer forms a control gate and a word line WL and the gate of an isolation transistor $T_I$.

FIG. 8 shows a conventional prior art split gate device is shown which includes a P– substrate with N+ S/D regions on either side of a polysilicon 1 floating gate and a polysilicon 2 control gate.

DESCRIPTION OF THE PREFERRED EMBODIMENT

This invention provides a structure and a process sequence for producing a high-density split-gate flash memory, which features very high capacitive coupling ratio.

Figure 1:
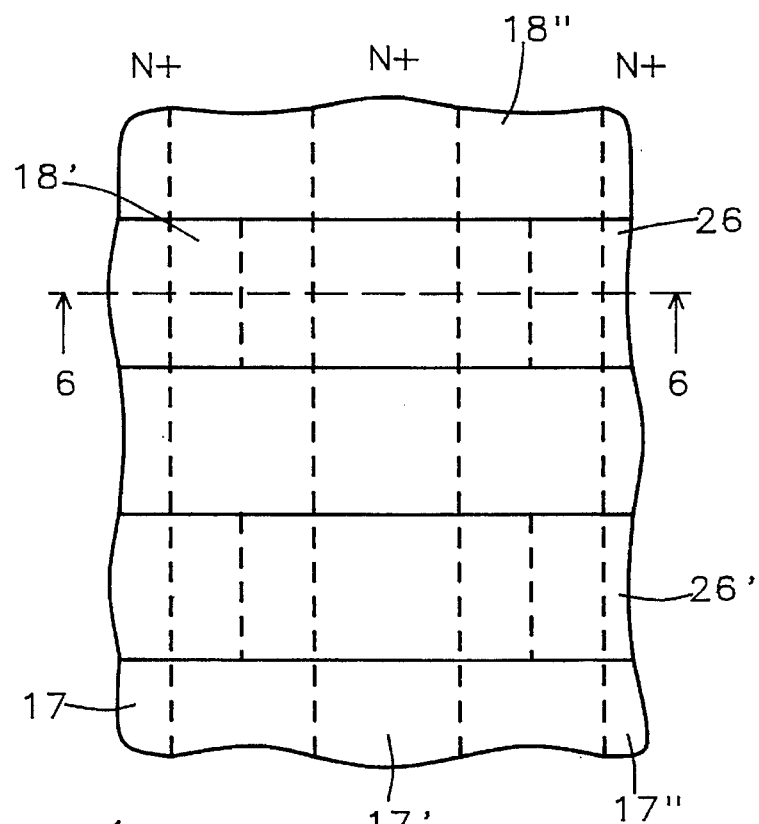
FIG. 1 shows a plan view of a fragment of an EPROM device in accordance with this invention.

FIG. 1 shows a plan view of a fragment of an EPROM device in accordance with this invention.

PROCESS

Front end process

Figure 2:
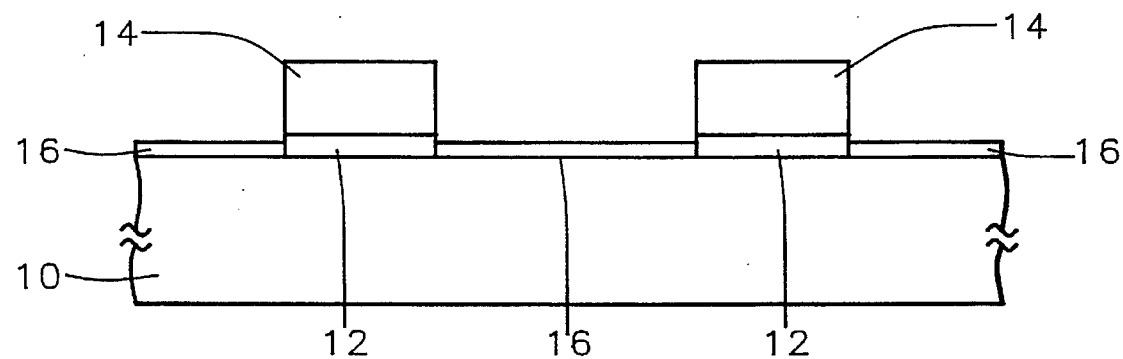
FIG. 2 shows a device in the early stages of fabrication in accordance with the method of this invention.

FIG. 2 shows a device in the early stages of fabrication in accordance with the method of this invention including a substrate 10 of silicon doped as a P-sub. An EPROM produced including the product of the following process comprises an embodiment of this invention.

Gate Oxidation

By the conventional process of gate oxidation the substrate 10 is covered with a blanket of gate oxide layer 12 to a thickness of about 200 Å in accordance with a process well known by those skilled in the art.

Silicon Nitride

A blanket deposition of a thin film silicon nitride sacrificial layer 14 is deposited to a thickness of about 2000 Å.

Silicon nitride ($Si_3N_4$) layer 14 is patterned by a standard photolithographic process followed by etching, thereby forming sacrificial silicon nitride structures 14 as shown in FIG. 2.

The sacrificial silicon nitride structures 14 are used for etching patterns in the gate oxide layer 12, removing all of the exposed surface of gate oxide layer 12. The method of etching the gate oxide layer 12 comprises a wet etch, 10:1 BHF (buffered hydrogen fluoride.)

Tunnel oxide

After the gate oxide layer 12 has been removed, tunnel oxide layer 16 is grown in place of the gate oxide to a thickness of about 100 Å. A range of thickness from about 60 Å to about 150 Å is possible. Outside of that range of thicknesses the result is inadequate because it is impractical since high voltage will be needed for program/erase operations. The process of growing the tunnel oxide is thermal oxidation in dry $O_2N_2$ (e.g. 850° C. for 20 minutes.)

Figure 3:
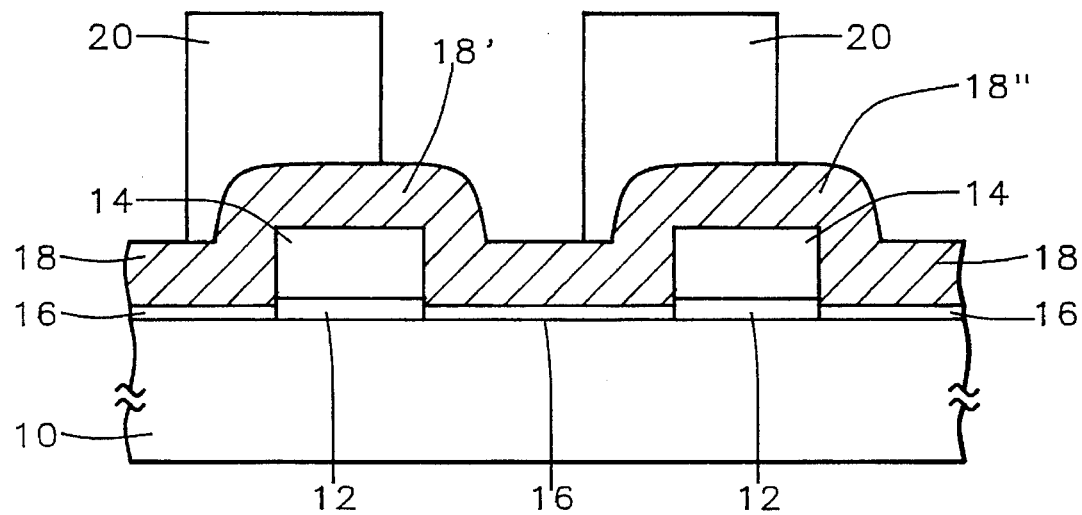
FIG. 3 shows the product of FIG. 2 after a blanket deposition of a polysilicon 1 layer followed by blanket deposition of photoresist formed into photoresist mask structures for etching the polysilicon 1 layer and making buried bit lines later.

Referring to FIG. 3, the product of FIG. 2 is shown after a blanket deposition polysilicon 1 layer 18 followed by blanket deposition of photoresist and formation of photoresist mask structures 20 for making buried bit lines later.

Polysilicon 1

The polysilicon 1 layer 18 was deposited to a thickness of about 2000 Å by the conventional LPCVD (low pressure chemical vapor deposition) process. A range of thickness from about 1000 Å to about 4000 Å is possible.

4

Polysilicon 1 layer 18 is doped with a blanket doping of phosphoryl chloride ($POCl_3$) at 900° C. for 20 minutes or by ion implantation. The arsenic (As) dopant is applied with a dose within a range from about $1\times10E14$ $cm^{-2}$ to about $1\times10E16/cm^{-2}$ within a range of energies from about 20 keV to about 80 keV.

Bit Line Masking

Figure 5:
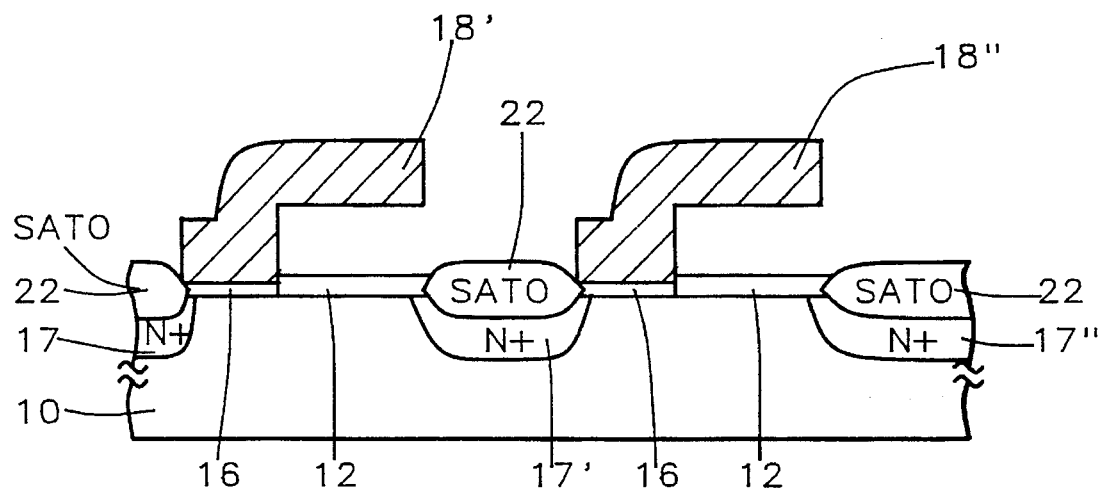
FIG. 5 shows the product of FIG. 4 is after Self Aligned Thick Oxide (SATO) regions were formed by oxidation of the surface of substrate forming silicon dioxide and the silicon nitride sacrificial structures are stripped by wet etching.

Then photoresist mask structures 20 (for etching polysilicon 1 layer 18 and making buried bit lines 17, 17'and 17" seen in FIGS. 5 and 6) are formed on the polysilicon 1 layer 18.

Polysilicon 1 Etching with Bit Line Mask

Figure 4:
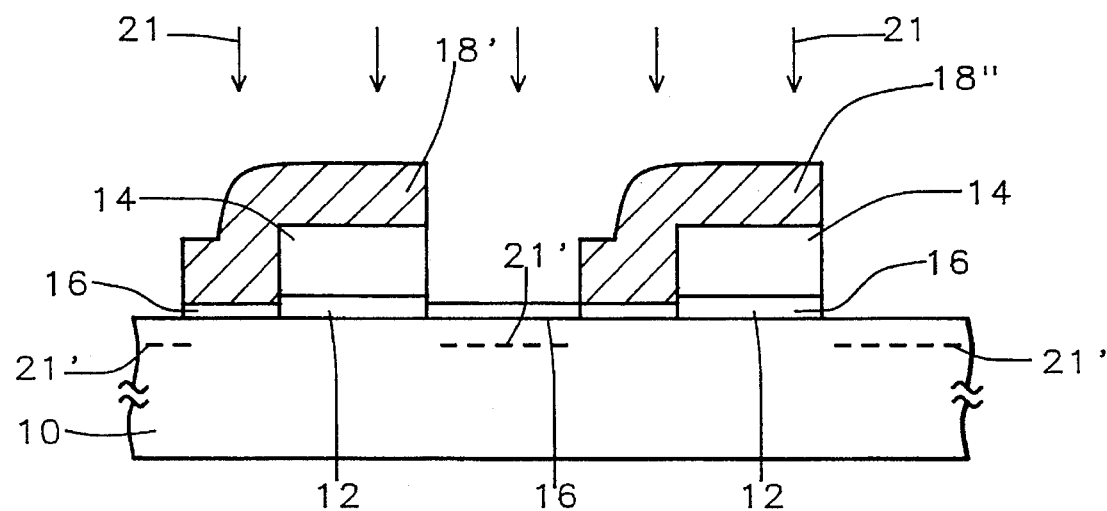
FIG. 4 shows the product of FIG. 3 after the mask structures have been used to etch the polysilicon 1 blanket layer, forming "stepped" polysilicon 1 structures and over and to the left of the silicon nitride structures

FIG. 4 shows the product of FIG. 3 after the mask structures 20 have been used to etch the polysilicon 1 blanket layer 18, forming "stepped" polysilicon 1 structures 18' and 18" over and to the left of the silicon nitride structures 14. Polysilicon 1 structures 18 and 18' are stepped in that they rise over sacrificial nitride structures 14 and they provide a pair of steps up from the substrate 10. The mask structures 20 have been removed from the device of FIG. 3 as shown in FIG. 4.

Bit Line Ion Implantation

To prepare to form buried bit lines in the substrate 10, arsenic (As) N+ dopant 21 is implanted into all of the exposed surface of the substrate 10 as dopant 21' using the polysilicon 1 structures 18' and 18" as masks. The implantation of those As ions is performed preferably with an energy of about 50 keV. A range of energies from about 30 keV to about 100 keV is possible. The dose of As is preferably $3\times10E15/cm^2$. A range of doses from about $1\times10E15$ $cm^{-2}$ to about $8\times10E16$ $cm^{-2}$ is possible.

Referring to FIG. 5, the product of FIG. 4 is shown after Self Aligned Thick Oxide (SATO) regions were formed by oxidation of the surface of substrate forming silicon dioxide and the silicon nitride sacrificial structures are now stripped by wet etching.

Self Aligned Thick Oxide (SATO)

To form the SATO regions 22, the surfaces of the substrate 10 in FIG. 4 were exposed to oxygen gas ($O_2$) at a preferred temperature of about 900° C., for an optimum time of about 10 minutes) of gate oxide layer 12. The SATO oxidation continues preferably until a thickness of about 500 Å is obtained as shown in FIG. 5. A range of thickness from about 300 Å to about 1500 Å is possible. Thicker SATO will have smaller capacitance between the control gate to the N+ area, which in turn will have a better coupling ratio. However, thicker SATO layers consume N+ dopant and result in higher $N^+$ bit line (B/L) resistance. SATO regions 22 are formed over the buried bit lines 17, 17' and 17". The process employed for forming the SATO regions 22 comprises thermal oxidation in a gas environment of oxygen ($O_2$) or oxygen/nitrogen $O_2/N_2$ under parameters within ranges as follows:

A range of temperatures from about 800° C. to about 950° C. is possible. Outside of that range of thicknesses the result is inadequate. For the lower temperatures the times are longer. For higher temperatures the time is reduced. At less than about 800° C. the oxidation rate is too slow to be practical. At above about 950° C. the temperature is too high and will cause too much diffusion of N+ ions. A range of times from about 10 minutes at about 950° C. to about 30 minutes at about 800° C. are examples of the range of times and temperatures possible.

Stripping of silicon nitride

The silicon nitride sacrificial structures 14 are now stripped by phosphoric acid ($H_3PO_4$) in a wet etch. There is no problem is removing the silicon nitride from below the overhanging polysilicon 1 layer 18', 18" because of the wet etching process which is isotropic. After structures 14 are removed the structure shown in FIG. 5 remains.

FIG. 6 shows the product of FIG. 5 after formation of interpolysilicon sandwich of dielectric (e.g. ONO) layer 24 followed by deposition of polysilicon 2 layer 26.

Interpolysilicon Dielectric (ONO)

Formation of interpolysilicon sandwich of dielectric (e.g. ONO) with an effective thickness of ONO, preferably of about 200 Å is applied to the exposed surfaces of the device of FIG. 5 by means of a conventional process. A range of thickness from about 150 Å to about 300 Å is possible. Outside of that range of thicknesses the result is inadequate because it is too thin (below about 150 Å) so that charge retention would be bad or too thick (above about 300 Å) because of reduced coupling ratio.

Polysilicon 2

Polysilicon 2 layer 26 which will serve as a word line (W/L) is deposited to a conventional thickness of from about 2000 Å to about 4000 Å.

The polysilicon 2 layer 26 is doped with a blanket doping of phosphoryl chloride ($POCl_3$) at about 900° C. for 20 minutes.

Polysilicon 2 layer 26 is patterned to form word line WL. This forms a stacked gate polysilicon 2/polysilicon 1 in a self-aligned etch.

Back end process

Conventional back end process steps follow.

Industrial Applicability

The polysilicon 2 word line WL also is located beneath the polysilicon 1 in areas where the silicon nitride structures 14 have been etched away. In this configuration, the polysilicon 1 structures 18', 18" form a floating gate structure. In that connection, referring to FIG. 7, which shows an electrical schematic diagram of a circuit formed on the device of FIG. 6, the polysilicon 2 layer 26 forms a control gate and a word line WL and the gate 26' of an isolation transistor $T_I$. Gate 26' is part of an isolation transistor along with ONO layer 24 gate oxide 12, P-sub 10 and buried N+ regions 17 and 17'. When gate 26/26'(WL) is at 0 volts the isolation transistor $T_I$ can isolate the cell conduction when the cell is over-erased (split gate structure) gate 26'. The polysilicon 1 structure 18' is surrounded by polysilicon 2 control gate structures 26/26'. As a result, the surface areas confronting each other between polysilicon 1 floating gate 18' and and polysilicon 2 control gate 26/26' structure are increased, and accordingly the coupling ratio is increased because of that increasing area of confrontation.

This structure can have split-gate flash cell characteristics, which are known to be able to overcome the overerase problem.

In addition, this structure can have a very high coupling ratio.

The example of the operation is summarized in the Table I below, where Vg is the voltage on control gate 26.

TABLE I

|  | $V_{DRAIN}$ | $V_{SOURCE}$ | Vg |
| --- | --- | --- | --- |
| PROGRAM | 6.0V | 0 V | 12 V |
| ERASE | 12.0V | 0 V | 0 V |
| READ | 1.5V | 0 V | 3 V |

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A MOSFET device formed on a semiconductor substrate comprising:
   a dielectric layer on said substrate;
   a first polysilicon layer formed over said dielectric layer in a stepped pattern partially on said dielectric layer and partially a step above said dielectric layer, said first polysilicon layer patterned to form a stepped electrode structure having an overhanging surface;
   ion implanted regions comprising source/drain for said MOSFET device formed in said substrate outside of the area covered by said stepped electrode structure;
   a second layer of dielectric material on exposed surfaces of said stepped electrode structure and said substrate; and
   a second polysilicon layer over and under overhanging portions of said second layer of dielectric material and said stepped electrode structure and said substrate, said stepped electrode structure and said second polysilicon layer separated by said second layer of dielectric material.

2. A device in accordance with claim 1 with buried bit lines implanted into said substrate, said buried bit lines formed continuous with said source/drain regions.

3. A device in accordance with claim 2 wherein said buried bit lines have been implanted into said substrate with arsenic (As) N+ dopant with an energy of between about 30 keV and about 100 keV, and a dose of As of between about 1 E 15/cm$^2$ and 6 E 16/cm$^2$.

4. A device in accordance with claim 1 wherein oxide structures are formed over said source/drain regions, said oxide structures each having an edge self-aligned to said first polysilicon layer.

5. A device in accordance with claim 4 wherein said oxide structures each have a second edge self aligned to an edge of a floating gate of an adjacent MOSFET device.

6. A MOSFET device formed on a semiconductor substrate comprising;
   a first dielectric layer on said substrate;
   a first polysilicon layer formed over said first dielectric layer, said first polysilicon layer formed in a stepped electrode pattern with a stepped portion spaced above said first dielectric layer and separated from said dielectric layer;

a blanket interpolysilicon layer formed over said first polysilicon layer and under said stepped portion of said first polysilicon layer where said first polysilicon layer is spaced above and separated from said first dielectric layer and over exposed portions of said first dielectric layer;

a second polysilicon layer formed over said interpolysilicon layer above said first polysilicon layer and under the exposed surfaces of said interpolysilicon layer beneath said stepped portion of said first polysilicon layer whereby said stepped electrode structure has an overhanging surface extending over a portion of a second polysilicon layer with said interpolysilicon layer therebetween; and first and second doped source/drain regions formed along a first and a second edge of said first polysilicon layer, a boundary of said first doped source/drain region formed self aligned to said first edge of said first polysilicon layer.

7. A MOSFET device in accordance with claim 6 wherein a boundary of said second doped source/drain region is formed self aligned to said second edge of said first polysilicon layer.

8. A MOSFET device in accordance with claim 6 with said doped source/drain regions are formed by ion implantation into said substrate with arsenic (As) N+ dopant with a dose of As between about 1 E 15/Cm² and 6 E 16/cm².

9. A MOSFET device in accordance with claim 6 with a self aligned oxide structure formed self-aligned to said source/drain regions.

10. A MOSFET device in accordance with claim 9 wherein said doped source/drain regions each have a second boundary self aligned to an edge of a floating gate of an adjacent MOSFET device.

11. A MOSFET device in accordance with claim 6, where Vg is the voltage on control gate and the device operates in accordance with this TABLE as follows:
Division of 08/244,695 filed Apr. 8, 1994

|  | $V_{DRAIN}$ | $V_{SOURCE}$ | Vg |
|---|---|---|---|
| PROGRAM | 6.0V | 0 V | 12 V |
| ERASE | 12.0V | 0 V | 0 V |
| READ | 1.5V | 0 V | 3 V |

12. A MOSFET device in accordance with claim 6, wherein said second polysilicon layer forms a control gate and a word line as well as the control gate of an isolation transistor $T_I$.

13. A MOSFET device formed on a semiconductor substrate comprising:

a first dielectric layer on said substrate with tunnel oxide regions formed therein;

a first polysilicon layer and a second polysilicon layer, said first polysilicon layer formed over said dielectric layer, and said second polysilicon layer formed over said tunnel oxide regions and other exposed surfaces of said device, said first polysilicon layer and said dielectric layer patterned into a stepped electrode structure partially over an interpolysilicon layer and said second polysilicon layer and partially upon said other exposed surfaces of said device, said stepped electrode structure having an overhanging surface extending over a portion of said second polysilicon layer;

first and second doped source/drain regions formed along a first and a second edge of said first polysilicon layer, a boundary of said first doped source/drain region formed self aligned to said first edge of said first polysilicon layer and a boundary of said second doped source/drain region formed self aligned to said second edge of said first polysilicon layer; and a second layer of dielectric material on upper surfaces of said stepped electrode structure and said substrate, said second polysilicon layer extending over the top surface of said second layer of dielectric material and under overhanging portions of said second layer of said dielectric material and said substrate.

14. A MOSFET device in accordance with claim 1, wherein said stepped electrode pattern of said first polysilicon layer is surrounded by said second polysilicon layer, and said second polysilicon layer comprises a control gate and said stepped electrode structure comprising a floating gate.

15. A MOSFET device in accordance with claim 6, wherein said stepped electrode structure of said first polysilicon layer is surrounded by said second polysilicon layer, and said second polysilicon layer comprises a control gate and said stepped electrode structure comprising a floating gate.

16. A MOSFET device in accordance with claim 13, wherein said stepped electrode structure of said first polysilicon layer is surrounded by said second
Division of 08/224,695 filed Apr. 8, 1994 polysilicon layer is surrounded by said second polysilicon layer, said second polysilicon layer comprises a control gate and said stepped electrode structure comprising a floating gate.

17. A MOSFET device in accordance with claim 13 with buried bit lines implanted into said substrate, the first and second source/drain regions forming part of a pair of said buried bit lines.

18. A MOSFET device in accordance with claim 17 with said buried bit lines having been implanted into said substrate with arsenic (As) N+ dopant with a dose of As between about 1 E 15/cm² and 6 E 16/cm².

19. A MOSFET device in accordance with claim 13 with a self aligned oxide structure formed self-aligned to said buried bit lines.

20. A MOSFET device in accordance with claim 13, where Vg is the voltage on control gate and the device operates in accordance with this TABLE as follows:

|  | $V_{DRAIN}$ | $V_{SOURCE}$ | Vg |
|---|---|---|---|
| PROGRAM | 6.0V | 0 V | 12 V |
| ERASE | 12.0V | 0 V | 0 V |
| READ | 1.5V | 0 V | 3 V |

\* \* \* \* \*